(12) United States Patent
Noguchi et al.

(10) Patent No.: US 8,268,686 B2
(45) Date of Patent: Sep. 18, 2012

(54) NONVOLATILE SEMICONDUCTOR MEMORY DEVICE WITH TWIN-WELL

(75) Inventors: Mitsuhiro Noguchi, Yokohama (JP); Minori Kajimoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/170,592

(22) Filed: Jun. 28, 2011

(65) Prior Publication Data

US 2011/0254097 A1    Oct. 20, 2011

Related U.S. Application Data

(60) Continuation of application No. 12/175,201, filed on Jul. 17, 2008, now Pat. No. 8,008,703, which is a division of application No. 11/031,036, filed on Jan. 10, 2005, now Pat. No. 7,800,154.

(30) Foreign Application Priority Data

Oct. 29, 2004  (JP) ................................. 2004-316704

(51) Int. Cl.
    *H01L 21/336* (2006.01)
(52) U.S. Cl. .................................. 438/257; 257/E21.68
(58) Field of Classification Search .................. 257/213, 257/219, 314–320; 438/197–215, 257–267
    See application file for complete search history.

(56) References Cited

U.S. PATENT DOCUMENTS

| 6,013,932 A | 1/2000 | Chevallier |
| 6,037,247 A | 3/2000 | Anand |
| 6,242,294 B1 | 6/2001 | Mitani et al. |
| 6,387,744 B2 | 5/2002 | Taniguchi et al. |
| 6,411,548 B1 | 6/2002 | Sakui et al. |
| 6,472,716 B2 | 10/2002 | Igaue et al. |
| 6,576,950 B1 * | 6/2003 | Cappelletti et al. ........... 257/318 |
| 7,148,093 B2 | 12/2006 | Makita |
| 7,402,495 B2 | 7/2008 | Noguchi et al. |
| 2003/0178699 A1 | 9/2003 | Nakazato et al. |
| 2006/0244094 A1 | 11/2006 | Kajimoto et al. |

FOREIGN PATENT DOCUMENTS

| JP | 5-259413 | 10/1993 |
| JP | 11-261021 | 9/1999 |
| JP | 2000-299475 | 10/2000 |
| JP | 2001028191 | 1/2001 |
| JP | 2001-102553 | 4/2001 |
| JP | 2004-47541 | 2/2004 |
| JP | 2004-047541 | 12/2004 |

OTHER PUBLICATIONS

"Super LSI Process Handbook," Science Forum, Inc. Apr. 15, 1982. P. 249.

* cited by examiner

*Primary Examiner* — Brook Kebede
(74) *Attorney, Agent, or Firm* — Oblon, Spivak, McClelland, Maier & Neustadt, L.L.P.

(57) ABSTRACT

A nonvolatile semiconductor memory device includes a first well of a first conductivity type, which is formed in a semiconductor substrate of the first conductivity type, a plurality of memory cell transistors that are formed in the first well, a second well of a second conductivity type, which includes a first part that surrounds a side region of the first well and a second part that surrounds a lower region of the first well, and electrically isolates the first well from the semiconductor substrate, and a third well of the second conductivity type, which is formed in the semiconductor substrate. The third well has a less depth than the second part of the second well.

11 Claims, 14 Drawing Sheets

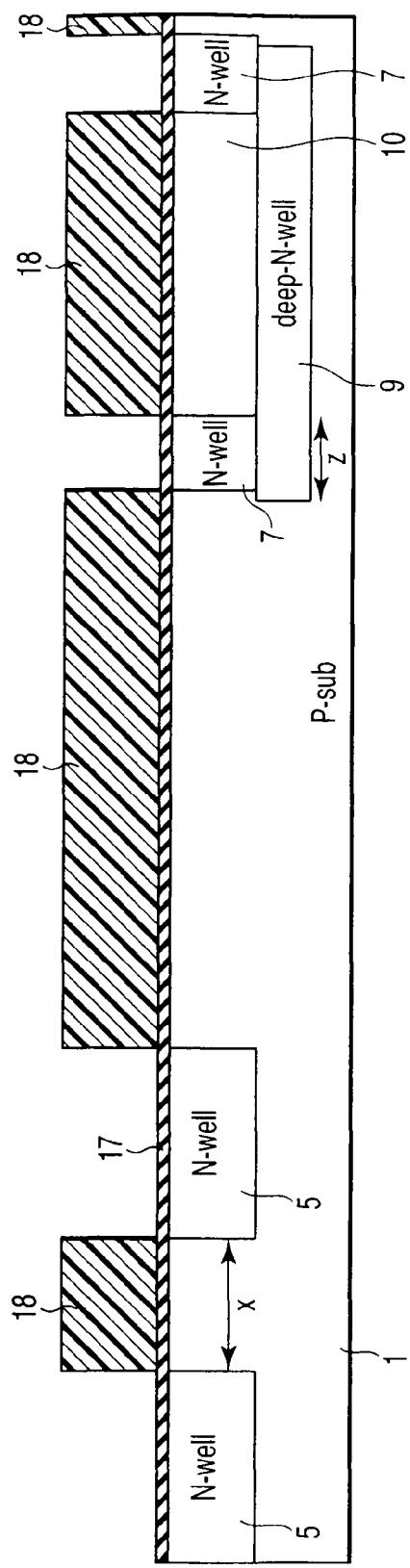
F I G. 7

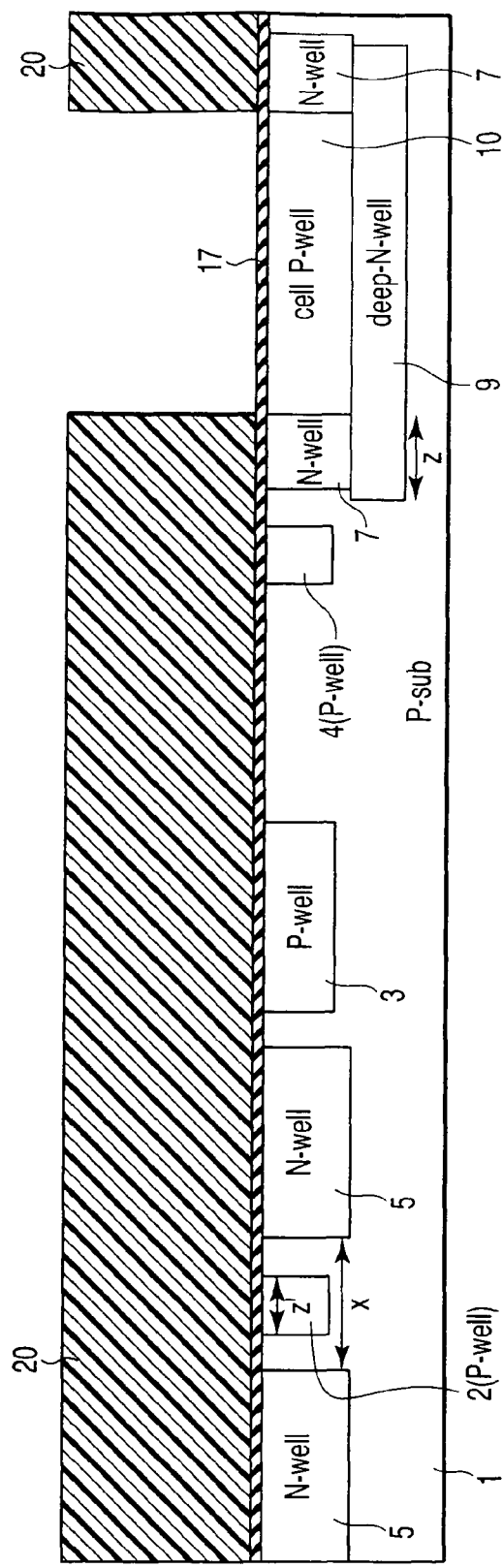
F I G. 9

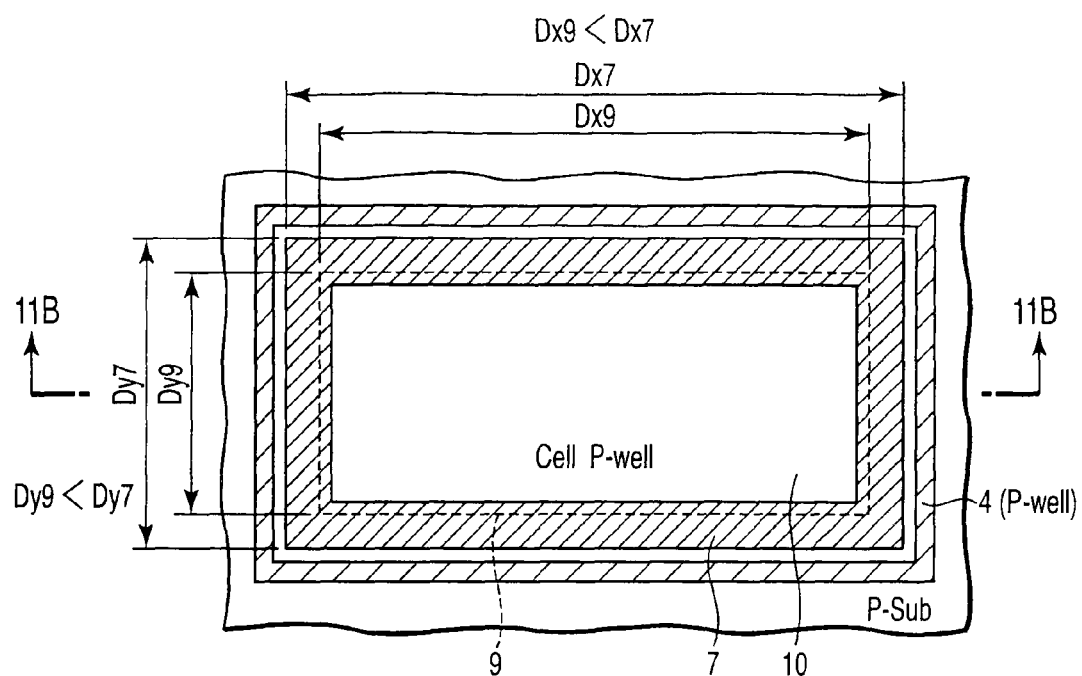
F I G. 1 1 A
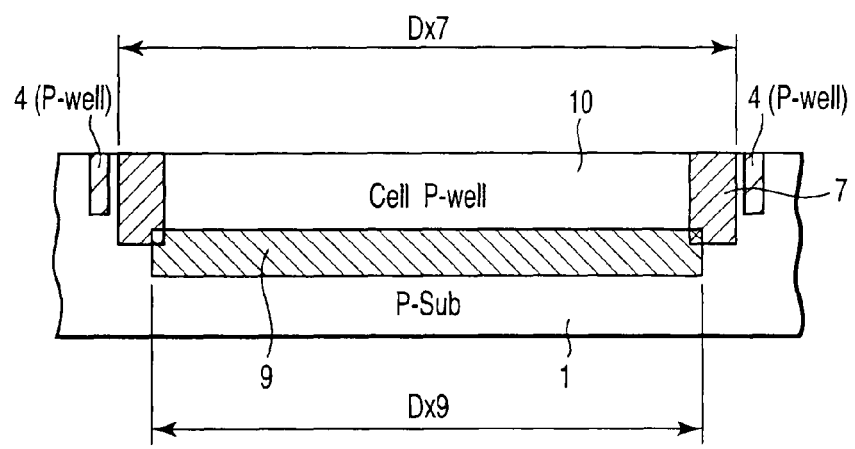
F I G. 1 1 B

US 8,268,686 B2

NONVOLATILE SEMICONDUCTOR MEMORY DEVICE WITH TWIN-WELL

CROSS-REFERENCE TO RELATED APPLICATIONS

This application is a continuation of U.S. application Ser. No. 12/175,201 filed Jul. 17, 2008, which is a divisional of U.S. application Ser. No. 11/031,036 filed Jan. 10, 2005, and is based upon and claims the benefit of priority from the prior Japanese Patent Application No. 2004-316704, filed on Oct. 29, 2004, the entire contents of each of which are incorporated herein by reference.

BACKGROUND OF THE INVENTION

1. Field of the Invention

The present invention relates generally to a nonvolatile semiconductor memory device, and more particularly to a nonvolatile semiconductor memory device having a twin-well in which a well potential is varied in accordance with operations, and a memory element formed in the twin-well, and also having an N-well and a P-well that are separated away from the twin-well.

2. Description of the Related Art

A memory cell of a nonvolatile semiconductor memory device, such as an EEPROM, normally has a MISFET structure wherein a charge accumulation layer and a control gate are stacked on a semiconductor substrate. The memory cell stores data in a nonvolatile state by a difference between a threshold in a state in which charge, e.g. electrons, is injected in the charge accumulation layer, and a threshold in a state in which the electrons are discharged. Of EEPROMs, a NAND-type EEPROM, which has a so-called NAND cell unit with a plurality of series-connected memory cells, can realize a higher integration density than a NOR-type EEPROM, since the number of select transistors in the NAND-type EEPROM can be made less than that in the NOR-type EEPROM.

In the NAND-type EEPROM, the injection and release of charge are effected by causing a tunneling current to flow through a tunneling insulation film that is formed between the charge accumulation layer and the substrate channel. In the NOR-type EEPROM, too, the tunnel current is used to erase data in order to reduce a short-channel effect at a time of data erasure.

The erasure of data is executed for a plurality of memory cells at a time, for example, in order to increase the number of memory cells for data erasure per unit time. To achieve this, a positive voltage of, e.g. 15V or more is applied to the cell well where the memory cell is formed, thereby drawing electrons out of the charge accumulation layer into the substrate. On the other hand, at a time of data write/read, the voltage at the cell well is kept at 0V, and the voltage that is applied to the source/drain of the memory cell is lowered. Thereby, the power for charging/discharging the cell well is decreased, and the operation speed is increased.

The EEPROM has a so-called twin-well structure wherein a P-well is surrounded by an N-well, and the P-well is electrically isolated from the semi-conductor substrate. Thereby, the cell well voltage can be varied in accordance with operations (e.g. U.S. Pat. No. 6,411,548).

FIG. 1 is a cross-sectional view showing a prior-art EEPROM having a twin-well.

As is shown in FIG. 1, a P-type cell well (cell P-well) 10 is formed in a P-type semiconductor substrate (P-sub) 1. An N-type well (N-well) 7 is formed on side surfaces of the P-type cell well 10. An N-type well 9 (deep-N-well) 9 is formed under the P-type cell well 10. An N-type well 8 is formed in contact with side surfaces of the N-type well 9. An upper part of the N-type well 8 is in contact with the lower part of the N-type well 7.

The P-type cell well 10, as described above, is surrounded by the N-type wells 7, 8 and 9 and is electrically isolated from the P-type substrate 1. This is the twin-well architecture. Memory cell transistors Q5-1 and Q5-2 are formed in the P-type cell well 10 of the twin-well.

The P-type cell well 10 has a depth of, e.g. 0.6 μm.

The N-type well 7, 8, 9 needs to be formed deeper than the P-type well 10, and is formed in the P-type substrate 1 that has a low impurity concentration, for instance, an impurity concentration lower than $10^{15}$ cm$^{-2}$. In addition, in order to keep voltage constant, the N-type well 7, 8, 9 is formed with a peak concentration of, e.g. $10^{16}$ cm$^{-2}$ or more. Consequently, the N-type well 7, 8, 9 spreads within the P-type substrate 1 with a depth of, e.g. 2 μm.

The EEPROM includes not only the memory cell transistors Q5-1 and Q5-2, but also logic peripheral circuits such as a control circuit for controlling the transistors Q5-1 and Q5-2 and a voltage control circuit for controlling the voltage of the P-type cell well 10. The EEPROM further includes a high voltage generating circuit for generating a high positive voltage for use in erasure, and a device and a circuit that use high voltage.

In order to form these circuits, P-type wells 2, 3 and 4 and N-type wells 5 and 6 are formed apart from the twin-well within the P-type semiconductor substrate 1.

The P-type well 2, 3, 4 has a depth of, e.g. about 1 μm.

The N-type well 5, 6 has the same depth as the N-type well 7, 8, 9, which is, e.g. 2 μm or more.

The logic peripheral circuit is composed of a CMOS circuit. A P-channel transistor (MOSFET) Q1 of the CMOS circuit is formed in the N-type well 5, 6, and an N-channel transistor (MOSFET) Q3 of the CMOS circuit is formed in the P-type well 3.

The high voltage generating circuit or the device or circuit that uses high voltage is composed of a high-withstand-voltage transistor having more excellent electrical withstand voltage characteristics than the peripheral circuit transistor that forms the logic peripheral circuit. A P-channel high-withstand-voltage transistor Q2 is formed in the N-type well 5, 6, and an N-channel high-withstand-voltage transistor Q4 is formed in the P-type substrate 1.

The P-type well 2 is a well for isolating the N-type well 5, 6, in which the high voltage generating circuit is formed, from the N-type well 5, 6, in which the logic peripheral circuit is formed. Similarly, the P-type well 4 is a well for isolating the twin-well from the high withstand voltage transistor Q4.

FIG. 2 to FIG. 4 are cross-sectional views illustrating the method of fabricating the EEPROM shown in FIG. 1.

To start with, a sacrificial oxide film 17 is formed on the P-type semiconductor substrate 1. A photoresist film 18 is formed on the sacrificial film 17. The thickness of the photoresist film 18 is between 1.8 μm and 4 μm. Subsequently, the photoresist film 18 is exposed/developed, and openings corresponding to a formation pattern of N-type wells 5, 6, 7, 8 are formed in the photoresist film 18. Using the photoresist film 18 as a mask, impurities, such as phosphorus or arsenic, for forming the N-type wells 5, 6, 7, 8, are ion-implanted in the substrate 1.

Next, as shown in FIG. 3, the photoresist film 18 is removed, and a photoresist is coated once again on the insulation film 17, and a photoresist film 19 is formed. The thickness of the photoresist film 19 is 1.6 μm or less. The photoresist film 19 is exposed/developed, and openings corresponding to a formation pattern of P-type wells 2, 3, 4 are formed in the photoresist film 19. Using the photoresist film 19 as a mask, impurities, such as boron or indium, for forming the P-type wells 2, 3, 4, are ion-implanted in the substrate 1.

Thereafter, as shown in FIG. 4, the photoresist film 19 is removed, and a photoresist is coated once again on the insulation film 17, and a photoresist film 20 is formed. The thickness of the photoresist film 20 is between 1.8 μm and 4 μm. The photoresist film 20 is exposed/developed, and an opening corresponding to a formation pattern of a P-type well 10 is formed in the photoresist film 20. Using the photoresist film 20 as a mask, impurities, such as phosphorus or arsenic, for forming an N-type well 9, are ion-implanted in the substrate 1. Further, using the photoresist film 20 as a mask, impurities, such as boron or indium, for forming the P-type well 10, are ion-implanted in the substrate 1.

Subsequently, as shown in FIG. 1, transistors Q1 to Q4 and memory cell transistors Q5-1 and Q5-2 are formed in the P-type substrate 1, P-type well 3, N-type wells 5, 6 and P-type cell well 10, respectively.

As regards the EEPROM shown in FIG. 1, however, there are the following circumstances.

(1) The depth L1 of the N-type well 5, 6 is equal to the depth L2 of the N-type well 9. Thus, the depth L1 of the N-type well 5, 6 is typically 2 μm or more.

Since the depth L1 of the N-type well 5, 6 is very large, the width z' of the P-type well 2 cannot be reduced to, e.g. 2 μm or less. If the width z' of the P-type well 2 is reduced to 2 μm or less, a punch-through current would flow through the substrate 1 under the P-type well 2 between the N-type well 5, 6, in which the high voltage generating circuit is formed, and the N-type well 5, 6, in which the logic peripheral circuit is formed. This phenomenon is particularly conspicuous when a high voltage of, e.g. 10V to 15V or more, relative to the P-type substrate 1, is applied to the N-type well 5, 6 where the high voltage generating circuit is formed.

Under the above circumstances, in the EEPROM shown in FIG. 1, it is difficult to reduce the distance x between the N-type well 5, 6, where the high voltage generating circuit is formed, and the N-type well 5, 6, where the logic peripheral circuit is formed.

In the case where a high voltage of 15V or more is applied to the N-type well 5, 6 in which the high voltage generating circuit is formed, it is also difficult to reduce the distance between the N-type well 5, 6 and the P-type well 2 to, e.g. 0.5 μm or less. The reason is that since regions with high impurity concentrations of a PN junction are located close to each other, a region with a high electric field occurs, resulting in degradation in junction breakdown voltage.

(2) Since the depth L1 of the N-type well 5, 6 is very large, the width of the N-type well 5, 6 tends to increase. Similarly, the width of the N-type well 7, 8 tends to increase. The reason is that the depth of the N-type well 7, 8 is equal to the depth L2 of the N-type well 9.

This is partly because the photoresist film 18 with a very large thickness of 1.8 μm is used in the photolithography step illustrated in FIG. 2. If the thickness of the photoresist film is large, the width of the N-type well 5, 6 tends to increase due to fall-down of the photoresist or due to resolution. For example, the width of the N-type well 5, 6 tends to become greater than the width z' of the P-type well 2 that is formed shallower than the N-type well 5, 6. Similarly, the width z of the N-type well 7, 8 tends to become greater than, e.g. the width z' of the P-type well 2.

Furthermore, reduction in the distance x is hindered by the fact that the width of the N-type well 5, 6 tends to increase.

Besides, reduction in distance y between the N-type well 7, 8 and the source/drain diffusion layer of the high-withstand-voltage transistor Q4 may possibly be hindered by the fact that the width z of the N-type well 7, 8 tends to increase.

BRIEF SUMMARY OF THE INVENTION

According to an aspect of the present invention, there is provided a nonvolatile semiconductor memory device comprising: a semiconductor substrate of a first conductivity type; a first well of the first conductivity type, which is formed in the semiconductor substrate; a plurality of memory cell transistors that are formed in the first well; a second well of a second conductivity type, which includes a first part that surrounds a side region of the first well and a second part that surrounds a lower region of the first well, and electrically isolates the first well from the semiconductor substrate; and a third well of the second conductivity type, which is formed in the semiconductor substrate, the third well having a less depth than the second part of the second well.

According to another aspect of the present invention, there is provided a nonvolatile semiconductor memory device comprising: a semiconductor substrate of a first conductivity type; a first well of the first conductivity type, which is formed in the semiconductor substrate; a plurality of memory cell transistors that are formed in the first well; a second well of a second conductivity type, which includes a first part that surrounds a side region of the first well and a second part that surrounds a lower region of the first well, and electrically isolates the first well from the semiconductor substrate; and a third well of the second conductivity type, which is formed in the semiconductor substrate, the third well having a less depth than the second part of the second well, wherein the first part has a less depth than the second part and a region of a change between the depth of the first part and the depth of the second part is present on an extension of a boundary line between the lower region of the first well and the second part.

According to still another aspect of the present invention, there is provided a nonvolatile semiconductor memory device comprising: a semiconductor substrate of a first conductivity type; a first well of the first conductivity type, which is formed in the semiconductor substrate and has an operation mode in which a positive voltage of 15V or more, relative to the semiconductor substrate, is applied to the first well; a plurality of memory cell transistors that are formed in the first well; a second well of a second conductivity type, which includes a first part that surrounds a side region of the first well and a second part that surrounds a lower region of the first well, and electrically isolates the first well from the semiconductor substrate; and a third well of the second conductivity type, which is formed in the semiconductor substrate, the third well having a less depth than the second part of the second well.

BRIEF DESCRIPTION OF THE SEVERAL VIEWS OF THE DRAWING

FIG. 7 is a cross-sectional view that illustrates a fabrication step of the nonvolatile semiconductor memory device according to the first embodiment of the invention;

FIG. 9 is a cross-sectional view that illustrates a fabrication step of the nonvolatile semiconductor memory device according to the first embodiment of the invention;

FIG. 11A is a plan view that shows the nonvolatile semiconductor memory device according to the second embodiment of the present invention;

FIG. 11B is a cross-sectional view taken along line 11B-11B in FIG. 11A;

DETAILED DESCRIPTION OF THE INVENTION

Figure 1:
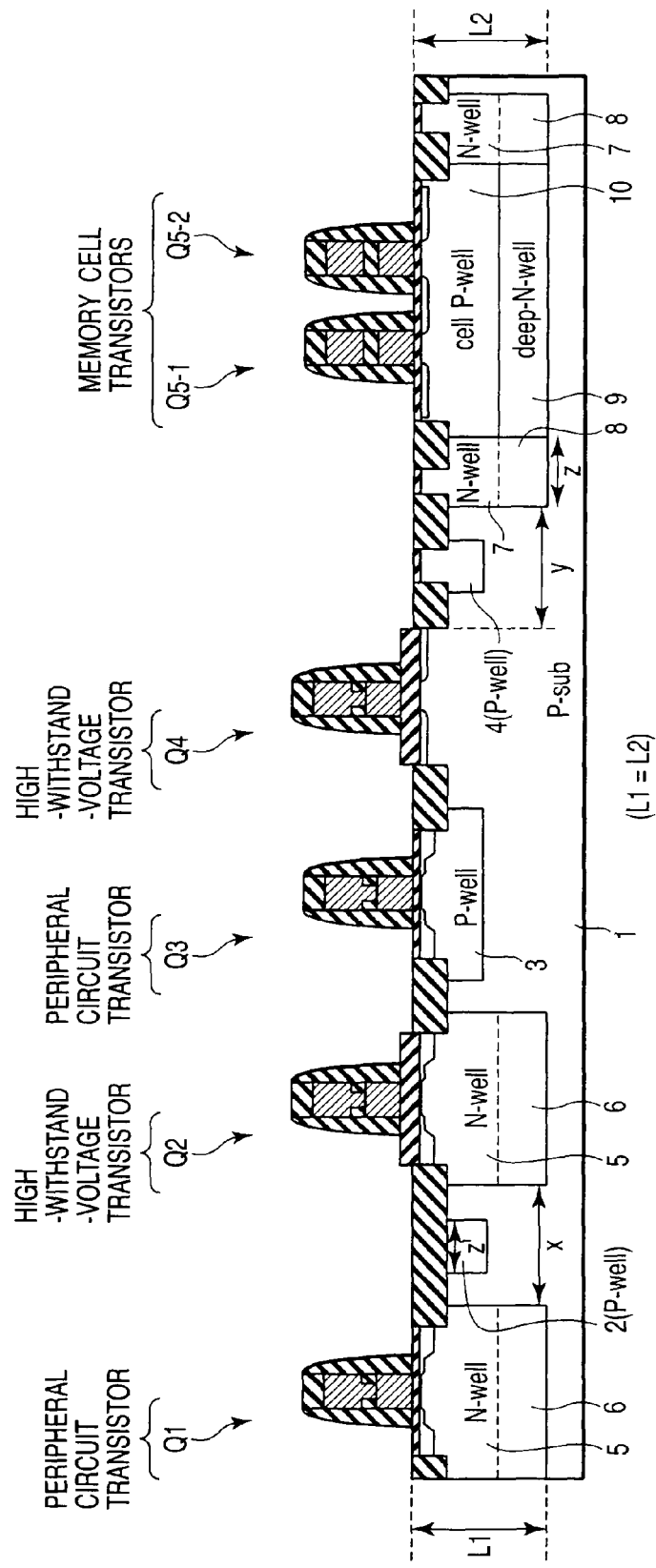
FIG. 1 is a cross-sectional view that shows a prior-art nonvolatile semiconductor memory device.
Figure 2:
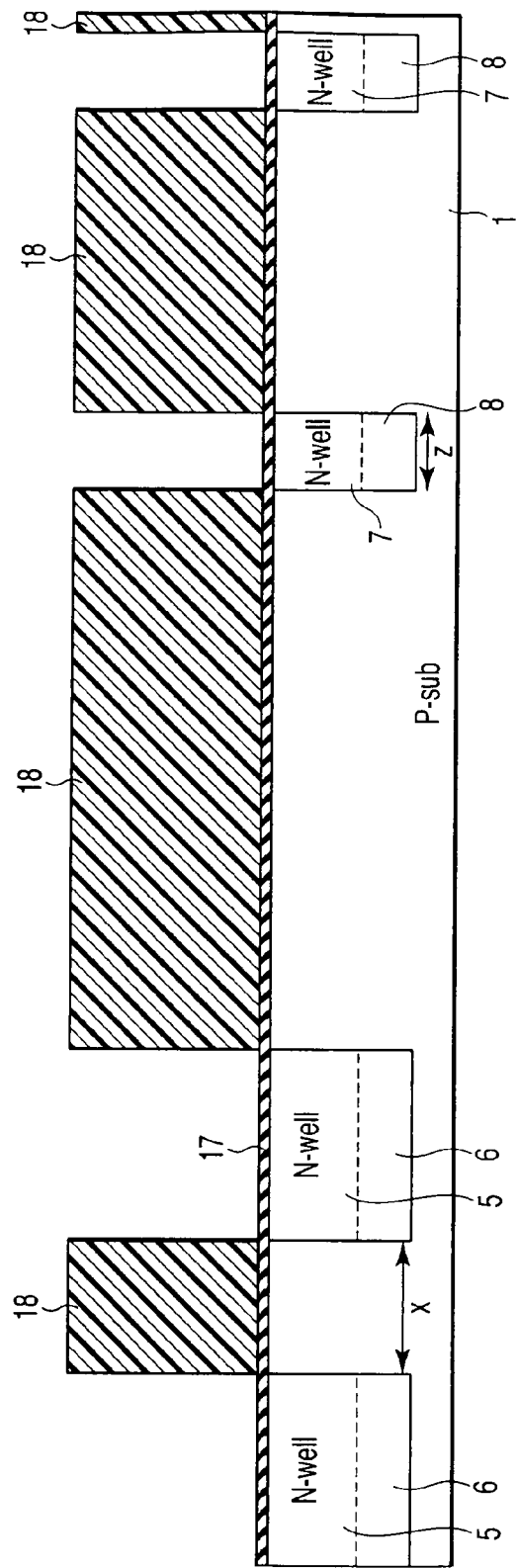
FIG. 2 is a cross-sectional view that illustrates a fabrication step of the prior-art nonvolatile semiconductor memory device.
Figure 3:
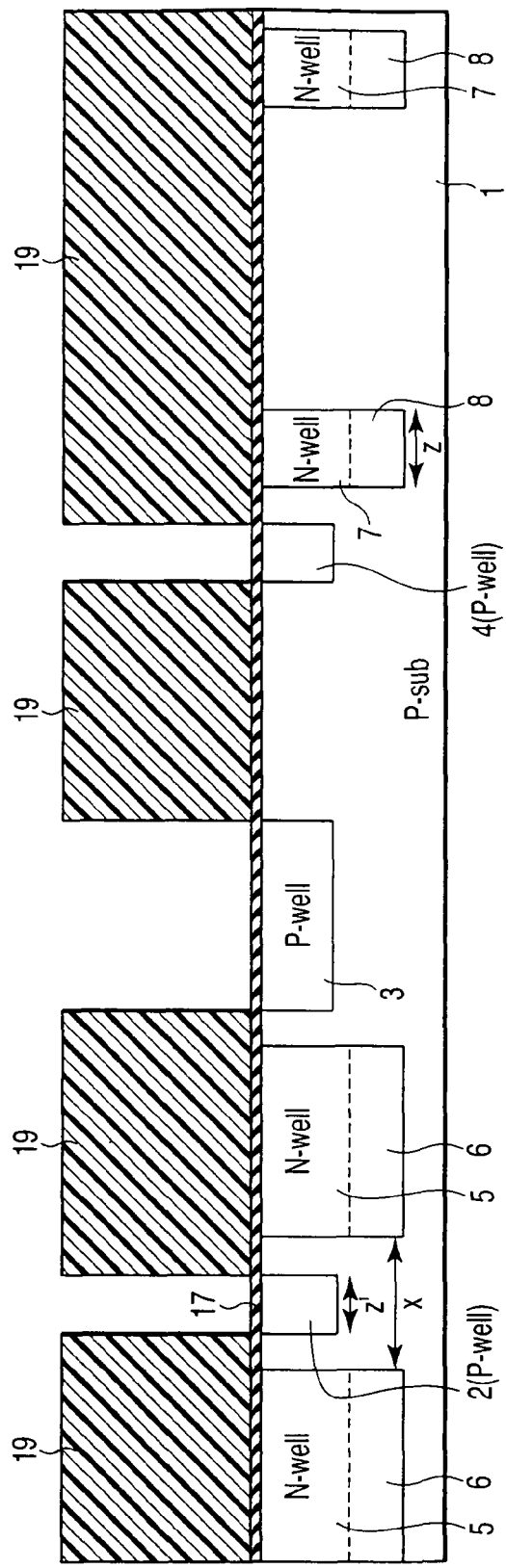
FIG. 3 is a cross-sectional view that illustrates a fabrication step of the prior-art nonvolatile semiconductor memory device.
Figure 4:
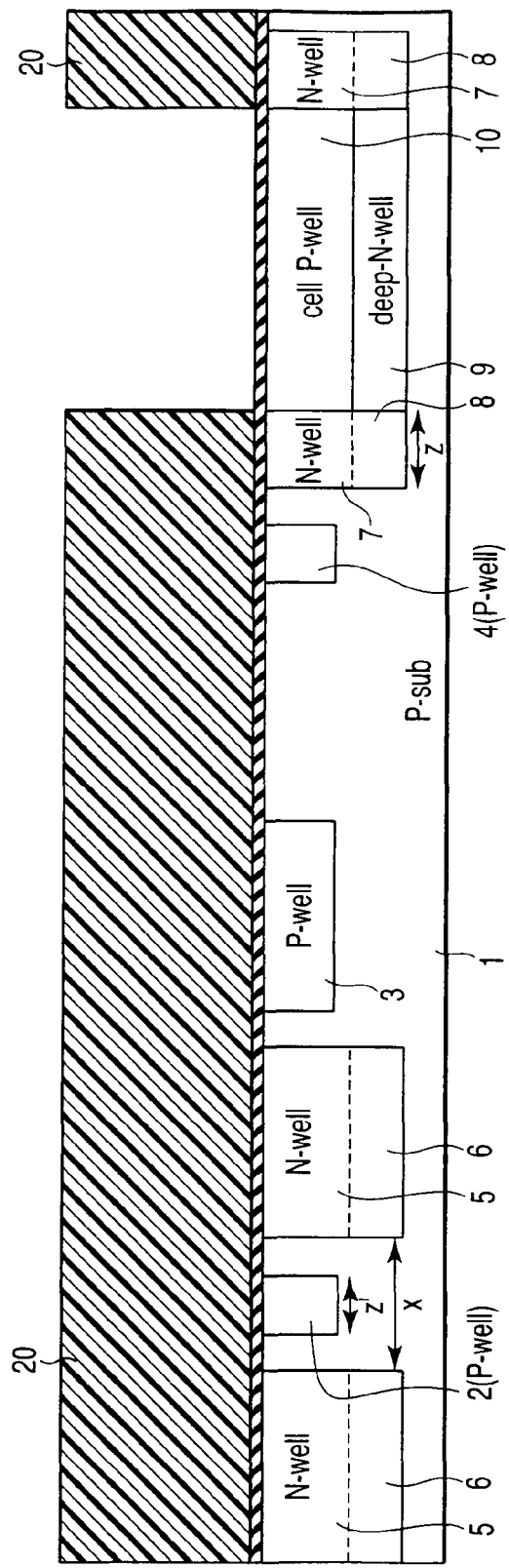
FIG. 4 is a cross-sectional view that illustrates a fabrication step of the prior-art nonvolatile semiconductor memory device.

Embodiments of the present invention will now be described with reference to the accompanying drawings. In the description below, common parts are denoted by like reference numerals throughout the drawings.

(First Embodiment)

Figure 5:
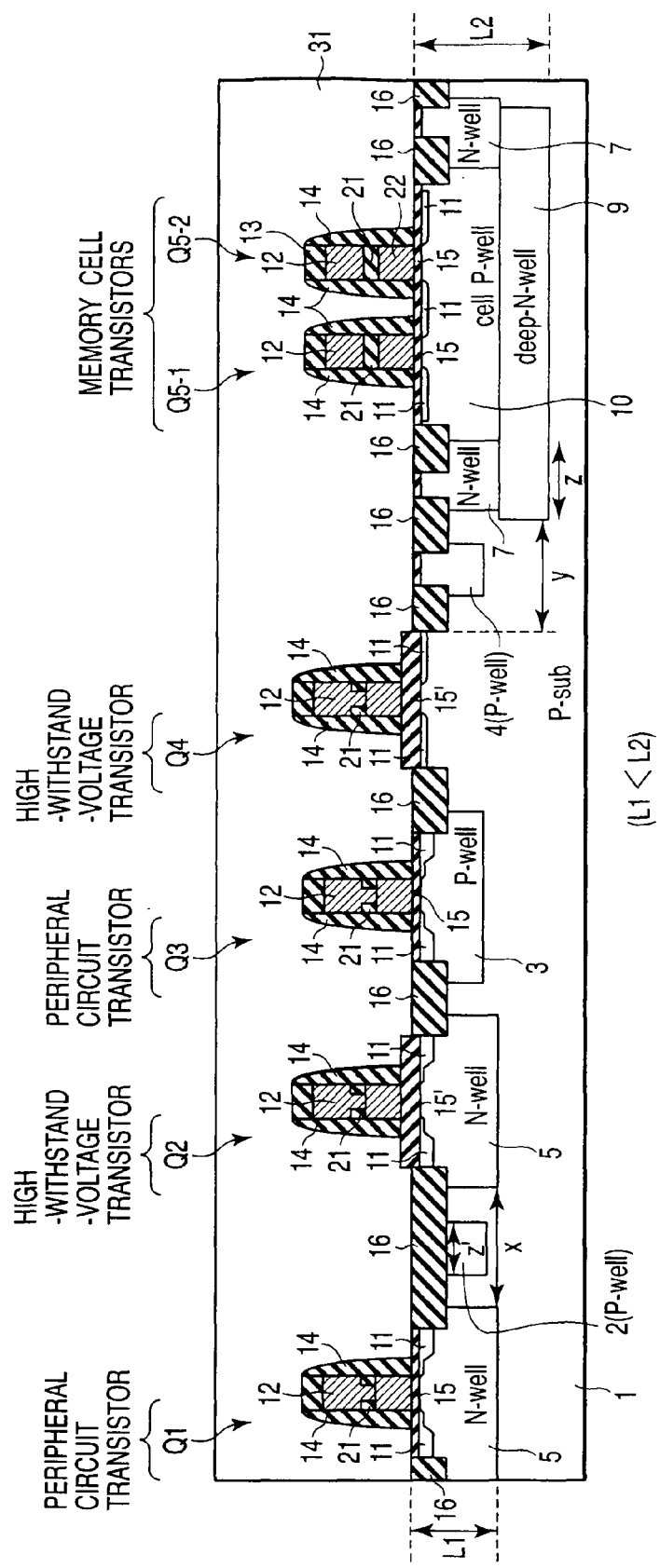
FIG. 5 is a cross-sectional view that shows a nonvolatile semiconductor memory device according to a first embodiment of the present invention.

FIG. 5 is a cross-sectional view that shows an example of the structure of a nonvolatile semiconductor memory device according to a first embodiment of the present invention.

As is shown in FIG. 5, a P-type cell well (cell P-well) 10 is formed in a P-type semiconductor substrate (P-sub) 1. An N-type well 7, for instance, is formed in contact with side surfaces of the P-type cell well 10. An N-type well (deep-N-well) 9, for instance, is formed in contact with a lower part of the P-type cell well 10. The N-type well 7 is in contact with the N-type well 9. Thus, the P-type cell well 10 is surrounded by the N-type wells 7, 9, and is electrically isolated from the substrate 1. Since the P-type cell well 10 is electrically isolated from the substrate 1, the voltage of the P-type cell well 10 can be varied independently from the substrate 1 in accordance with operations. A so-called twin-well architecture is thus formed. The twin-well architecture can reduce the load on a booster circuit, for example, at a data erasure time, and can reduce power consumption.

Memory cell transistors Q5-1 and Q5-2, which form a memory cell, are formed in the P-type cell well 10. The memory cell transistors Q5-1 and Q5-2 are isolated by device isolation regions 16 that are formed in surface regions of the P-type substrate 1. An example of the device isolation region 16 is a so-called shallow trench isolation (STI) region, which is formed by forming a trench with a depth of, e.g. 0.1 μm to 0.3 μm and filling the trench with an insulator such as a silicon oxide film.

The potential of the P-type cell well 10 needs to be made uniform in order to realize uniform erasure in a plurality of memory cells. For this purpose, the depth of the cell well 10, i.e. the level of the boundary between the cell well 10 and N-type well 9, is set to be sufficiently deeper than the device isolation region 16. That is, the depth is set, e.g. between 0.4 μm and 0.9 μm. The depth of the P-type cell well 10 is, for instance, 0.5 μm. The impurity concentration of the cell well 10, for instance, the concentration of boron, is between $10^{14}$ $cm^{-3}$ and $10^{19}$ $cm^{-3}$. The depth of the N-type well 9, i.e. the level of the boundary between the N-type well 9 and the substrate 1, is set in the range of 1.2 μm and 4 μm.

A gate insulation film 15 is formed on the surface of the P-type cell well 10. The gate insulation film 15 is formed of, for instance, a silicon oxide film or an oxinitride film with a thickness of 3 nm to 15 nm.

A floating gate 22 is formed on the gate insulation film 15. The floating gate 22 functions as a charge accumulation layer that accumulates charge. The floating gate 22 is formed of, e.g. an electrically conductive polysilicon film in which phosphorus or arsenic is added in a concentration range of $10^{18}$ $cm^{-3}$ to $10^{21}$ $cm^{-3}$. The floating gate 22 has a thickness of, e.g. 10 nm to 500 nm. The floating gate 22 is formed within a device formation region that is defined by the device isolation regions 16. The floating gate 22 is formed, for example, by successively stacking films that become the gate insulation film 15 and floating gate 22. These films are patterned, and the P-type cell well 10 is etched by a depth of, e.g. 0.1 μm to 0.3 μm, thus forming a trench. The trench is filled with an insulator such as a silicon oxide film. Thus, the floating gate 22 can be formed in a planar shape, without a stepped portion.

A block insulation film 21 is formed on the floating gate 22. The block insulation film 21 is formed of, for instance, a silicon oxide film, an oxinitride film, or a stacked film of silicon oxide/silicon nitride/silicon oxide films, each of which has a thickness of 5 nm to 30 nm.

A control gate 12 is formed on the block insulation film 21. The control gate 12 is formed of, for instance, an electrically conductive polysilicon film in which phosphorus, arsenic or boron is added in a concentration range of $10^{17}$ $cm^{-3}$ to $10^{21}$ $cm^{-3}$, or a stacked film of WSi (tungsten silicide) and polysilicon, or a stacked film of NiSi, MoSi, TiSi, or CoSi and polysilicon. The thickness of the control gate 12 is, e.g. 10 nm to 500 nm.

A silicon oxide film or silicon nitride film 13 is formed on the control gate 12.

A side-wall insulation film 14 is formed on the side surface of the stacked gate structure that comprises the floating gate 22, block insulation film 21, control gate 12 and silicon nitride film 13. The side-wall insulation film 14 is formed of, e.g. a silicon nitride film or silicon oxide film with a thickness of 5 nm to 490 nm.

N-type diffusion layers 11, which become a source and a drain, are formed in the P-type cell well 10. The N-type diffusion layer 11 includes, e.g. phosphorus, arsenic or antimony such that the surface concentration thereof is $10^{17}$ $cm^{-3}$ to $10^{21}$ $cm^{-3}$, and the depth of the N-type diffusion layer 11 is, for instance, 10 nm to 500 nm. The diffusion layers 11 are formed in a self-alignment fashion, relative to the stacked gate structure.

The example of the memory cell transistor Q5-1, Q5-2, as shown in FIG. 5, is a floating gate-type EEPROM that includes the diffusion layers 11, floating gate 22 and control gate 12 and uses the charge accumulated in the floating gate 22 as an information quantity. The gate length of the transistor is, e.g. not greater than 0.5 μm and not less than 0.01 μm. In addition, the memory cell transistor Q5-1, Q5-2 may share the N-type diffusion layers 11 with adjacent memory cell, thereby constituting a so-called NAND-type cell unit. Of EEPROMs, a so-called NAND-type EEPROM that includes the NAND cell unit is advantageous for higher integration density, compared to the NOR-type EEPROM, since the number of select transistors is smaller.

The NAND-type EEPROM uses a tunneling current flowing between the floating gate 22 and the substrate channel in order to effect data erasure, that is, injection or release of charge in/from the floating gate 22. In the NOR-type flash memory, too, the tunneling current is, in some cases, used at the time of data erasure in order to suppress a short-channel effect.

Data erasure is performed in a plurality of memory cell transistors at a time in order to increase the number of memory cells in which data erasure is effected per unit time. In short, the memory cell transistors enables batch-erasure of data. For this purpose, a positive voltage of 15V or more, relative to the substrate 1, is applied to the cell well 10. Thereby, electrons are drawn out of the floating gate 22 into the P-type cell well 10.

On the other hand, when data read/write is performed, the voltage of the P-type cell well 10 is kept at 0V and the voltage that is to be applied to the N-type diffusion layer 11 is lowered. Thereby, the power for charging/discharging the P-type cell well 10 is reduced, and the operation speed is increased.

In the nonvolatile semiconductor memory device according to this embodiment, data erasure, data read-out and data write are switched by an input signal that is supplied from outside. This requires provision of a control circuit that controls the memory cell transistors Q5-1 and Q5-2, and a logic peripheral circuit such as a circuit that changes the voltage of the P-type cell well in accordance with an input signal.

The logic peripheral circuit is composed of, e.g. a CMOS circuit in order to reduce power consumption. The CMOS circuit requires the P-type well 3 that has a sufficiently lower resistance than the P-type cell well 10 in order to prevent latch-up. For this purpose, the substrate 1 includes the P-type well 3 for formation of an N-channel MOSFET ("NMOS"), aside from the P-type cell well 10. A P-channel MOSFET ("PMOS") is formed in the N-type well 5. The depth of each of the P-type well 3 and N-type well 5 is in a range of, e.g. 0.5 μm to 1.6 μm. For instance, this depth is set at about 1 μm. This depth is shallower than the depth of the N-type well 5, 6 shown in FIG. 1, which is 2 μm or more.

FIG. 5 shows a transistor (peripheral circuit transistor) Q1 as a PMOS. The transistor Q1 is formed in the N-type well 5. The transistor Q1 has substantially the same gate structure as the memory cell transistor Q5-1, Q5-2. The difference is that the control gate 12 and floating gate 22 are connected via an opening that is formed in the block insulation film 21. Thus, the control gate 12 and floating gate 22 can be used as a single gate electrode.

FIG. 5 also shows a transistor (peripheral circuit transistor) Q3 as an NMOS. The transistor Q3 is formed in the P-type well 3. The transistor Q3 has the same gate structure as the transistor Q1.

Further, the EEPROM requires a high voltage generating circuit that generates a high voltage from a low voltage. The high voltage generating circuit generates a potential difference of, e.g. 10V to 15V or more, relative to, e.g. the substrate 1. For this purpose, the high voltage generating circuit includes a booster circuit. An example of the booster circuit is a charge-pump circuit. The charge-pump circuit is composed of a plurality of capacitors for accumulating charge and a plurality of transistors for controlling the accumulation of charge.

In this embodiment, a transistor Q2 is shown as an example of the capacitor and transistor. The transistor Q2 is a high-withstand-voltage transistor. The high-withstand-voltage transistor has a thicker gate insulation film 15' than the peripheral circuit transistor Q1, Q3 so as to withstand, e.g. a potential difference of 15V or more relative to the potential of the substrate 1. The gate insulation film of the transistor Q2 is formed of a silicon oxide film or an oxinitride film with a thickness between 16 nm and 50 nm.

In the flash memory, when data erasure or data write is executed, a positive voltage of 15V or more is normally applied to the cell well 10 or the gate electrode of the transistor. From this standpoint, too, the flash memory requires the high-withstand-voltage transistor Q4 that has a thicker gate insulation film 15' than the transistor Q1, Q3. The gate insulation film of the transistor Q4 is formed of a silicon oxide film or an oxinitride film with a thickness between 16 nm and 50 nm. Like the transistor Q2, a voltage of 15V or more is applied between the drain of the high-withstand-voltage transistor Q4 and the substrate. This requires a region with a lower impurity concentration than the P-type well 3, for example, with an impurity concentration lower than $10^{15}$ cm$^{-2}$. In this embodiment, the P-type semiconductor substrate 1 is used as this region. FIG. 5 shows, for example, the high-withstand-voltage transistor Q4 that is formed in the substrate 1.

As is shown in FIG. 5, a P-type well 4 may be formed between the high-withstand-voltage transistor Q4 and the N-type well 7. The P-type well 4 may be formed so as to surround the N-type well 7.

An insulation layer 31, which is a so-called interlayer insulation layer, is formed on the transistors Q1 to Q4 and memory cell transistors Q5-1 and Q5-2.

In order to make still finer the structure of the nonvolatile semiconductor memory device shown in FIG. 5, the dimensions of the P-type well 3 and N-type well 5, in particular, the dimensions of the N-type well 5, should be reduced.

In the present first embodiment, in order to reduce the dimensions of, in particular, the N-type well 5, the depth L1 of the N-type well 5 is made shallower than the depth L2 of the N-type well 9 (L1<L2), as shown in FIG. 5. The depth L1 of the N-type well 5 can be set in a range of, e.g. 0.5 μm to 1.6 μm. For example, the depth L1 can be set at about 1 μm.

As a result, the width z' of the P-type well 2 can be reduced to, e.g. 2 μm or less. For instance, the width z' of the P-type well 2 is set at about 1.6 μm. In the nonvolatile semiconductor memory device shown in FIG. 5, even if the width z' of the P-type well 2 is reduced to about 1.6 μm, it is possible to suppress flow of punch-through current via the substrate 1 under the P-type well 2 between the N-type well 5, where the high-withstand-voltage generating circuit is formed, and the N-type well where the logic peripheral circuit is formed.

This advantageous effect can also be obtained in a case where a charge-pump circuit is constructed by forming, in the N-type well 5, a high-withstand-voltage transistor Q2 that includes, as the gate insulation film 15, a silicon oxide film with a thickness between, e.g. 12 nm and 50 nm, or a MOS capacitor (formed by using, e.g. the high-withstand-voltage transistor Q2), and a voltage of 10V to 15V or more, relative to the substrate 1, is applied to the N-type well 5. In addition, this advantageous effect can also be obtained in a case where a high-withstand-voltage transistor Q2, whose source or drain is connected to the P-type cell well 10 or to the gate electrode 12 of the memory cell transistor Q5-1, Q5-2, is formed in the N-type well 5, to which a voltage of 10V to 15V or more, relative to the substrate 1, is applied. If the high-withstand-voltage transistor Q2 is used in the charge-pump circuit or in a high voltage feed system in the circuit, a high voltage can be transmitted without a decrease corresponding to the threshold value.

Therefore, in the first embodiment, it is possible to reduce the distance x between the N-type well 5, where the high voltage generating circuit is formed, an the N-type well 5 where the logic peripheral circuit is formed.

The depth L1 of the N-type well 5 is less than the depth of the EEPROM in FIG. 1. Thus, the width of the N-type well 5 does not tend to easily increase. Similarly, the width of the N-type well 7 does not tend to easily increase. The reason is that the depth of the N-type well 7 is less than the depth L2 of the N-type well 9.

In the first embodiment, since the width of the N-type well 5, 6 does not tend to easily increase, further reduction in distance x is possible. Moreover, since the width z of the N-type well 7 does not tend to easily increase, further reduction is possible in distance y between the N-type well 7 and the N-type diffusion layer 11 that becomes the source/drain of the high-withstand-voltage transistor Q4.

As has been described above, the first embodiment can provide a nonvolatile semiconductor memory device that is advantageous for microfabrication, and includes the twin-well and the wells located apart from the twin-well.

Next, an example of a method of manufacturing the nonvolatile semiconductor memory device according to the first embodiment is described.

FIG. 6 to FIG. 9 are cross-sectional views illustrating the example of the method of manufacturing the nonvolatile semiconductor memory device according to the first embodiment of the invention.

Figure 6:
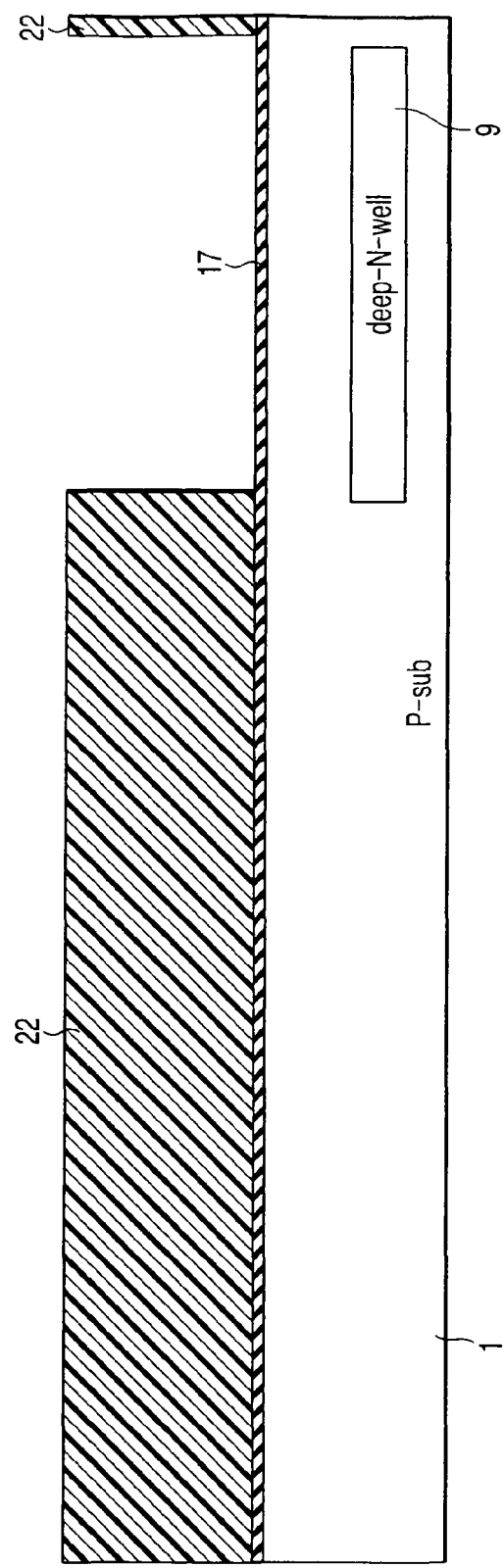
FIG. 6 is a cross-sectional view that illustrates a fabrication step of the nonvolatile semiconductor memory device according to the first embodiment of the invention.

To start with, as shown in FIG. 6, an insulation film (e.g. sacrificial oxide film) 17 with a thickness of, e.g. about 10 nm is formed on a P-type semiconductor substrate (e.g. P-type silicon substrate) 1. A photoresist is coated on the insulation film 17, and a photoresist film 22 is formed. The thickness of the photoresist film 22 is between 1.8 μm and 4 μm. The reason why the thickness is large is that the photoresist film 22 is used as a mask for forming an N-type well (deep-N-well) 9. Subsequently, the photoresist film 22 is exposed/developed, and an opening corresponding to a formation pattern of the N-type well 9 is formed in the photoresist film 22. Using the photoresist film 22 as a mask, impurities, such as phosphorus or arsenic, for forming the N-type well 9 is ion-implanted in the substrate 1.

Next, as shown in FIG. 7, the photoresist film 22 is removed, and a photoresist is coated once again on the insulation film 17, and a photoresist film 18 is formed. The thickness of the photoresist film 18 is, for instance, not greater than 1.6 μm and not less than 0.6 μm. This thickness is less than the thickness of the photoresist film 22. To be more specific, the thickness of the photoresist film 18 may be less than the thickness of the photoresist 22, i.e. 1.8 μm or more, if implanted impurities do not penetrate the photoresist film 18. Since the photoresist film 18 is thinner than the photoresist film 22, the problem that the width of the well tends to increase in order to prevent fall-down or resolution degradation of the thick photoresist can be improved, compared to the case of the photoresist film 22. Therefore, the N-type well 5, 7 with a small width can be obtained. In addition, if the thickness of the photoresist film is small, removal of the photoresist film is easier. This can advantageously decrease the process time for photolithography. Moreover, if the thickness of the photoresist film is small, the amount of photoresist used can be reduced and thus the cost of material can be reduced. Furthermore, an ion implantation step for forming a deep N-type well with a thickness of 1 μm can be omitted.

Subsequently, the photoresist film 18 is exposed/developed, and openings corresponding to a formation pattern of N-type wells 5, 7 are formed in the photoresist film 18. Using the photoresist film 18 as a mask, impurities, such as phosphorus or arsenic, for forming the N-type wells 5, 7 are ion-implanted in the substrate 1. The depth of the N-type well 7 should be set such that the N-type well 7 reaches the upper part of the N-type well 9. Therefore, the depth of the N-type well 7 can be made shallower than the N-type well 9. Since the N-type well 5 is formed in the same fabrication step as the N-type well 7, the depth of the N-type well 5 becomes equal to that of the N-type well 7. Therefore, the depth of the N-type well 5 is shallower than the depth of the N-type well 9.

Figure 8:
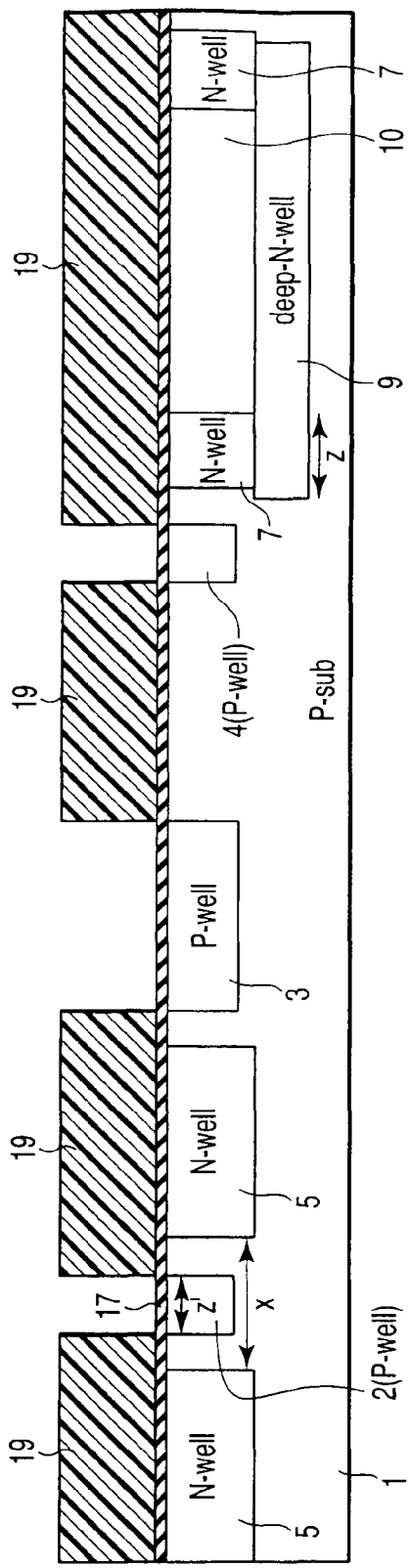
FIG. 8 is a cross-sectional view that illustrates a fabrication step of the nonvolatile semiconductor memory device according to the first embodiment of the invention.

Next, as shown in FIG. 8, the photoresist film 18 is removed, and a photoresist is coated once again on the insulation film 17, and a photoresist film 19 is formed. The thickness of the photoresist film 19 may be substantially equal to, e.g. that of the photoresist 18 and is not greater than 1.6 μm and not less than 0.6 μm. Thereby, like the N-type well 5, narrow P-type wells 2, 3 and 4 can be obtained. Subsequently, the photoresist film 19 is exposed/developed, and openings corresponding to a formation pattern of P-type wells 2, 3, 4 are formed in the photoresist film 19. Using the photoresist film 19 as a mask, impurities, such as boron or indium, for forming the P-type wells 2, 3, 4, are ion-implanted in the substrate 1.

Thereafter, as shown in FIG. 9, the photoresist film 19 is removed, and a photoresist is coated once again on the insulation film 17, and a photoresist film 20 is formed. The thickness of the photoresist film 20 is, for instance, between 1.8 μm and 4 μm. The reason why this thickness is large is that the photoresist film 20 is used as a mask for forming a P-type cell well (cell P-well) 10. The photoresist film 20 is exposed/developed, and an opening corresponding to a formation pattern of the P-type well 10 is formed in the photoresist film 20. Using the photoresist film 20 as a mask, impurities, such as boron or indium, for forming the P-type well 10, are ion-implanted in the substrate 1.

Subsequently, as shown in FIG. 5, transistors Q1 to Q4 and memory cell transistors Q5-1 and Q5-2 are formed by a well-known method in the substrate 1, P-type well 3, N-type well 5 and P-type cell well 10. Thus, the nonvolatile semiconductor memory device according to the first embodiment of the invention is completed.

According to the above-described example of the manufacturing method, the N-type well 9 is formed by a fabrication step that is independent from the fabrication steps of the N-type well 5, 7 and P-type cell well 10. In addition, the N-type well 7 is formed so shallow as to come in contact with the upper part of the N-type well 9, and the N-type well 5 is formed at the same time as the N-type well 7. Hence, there is no need to form deep N-type wells 5 for the transistors Q1 and Q2, and it becomes possible to reduce the width of each N-type well 5.

(Second Embodiment)

Figure 10:
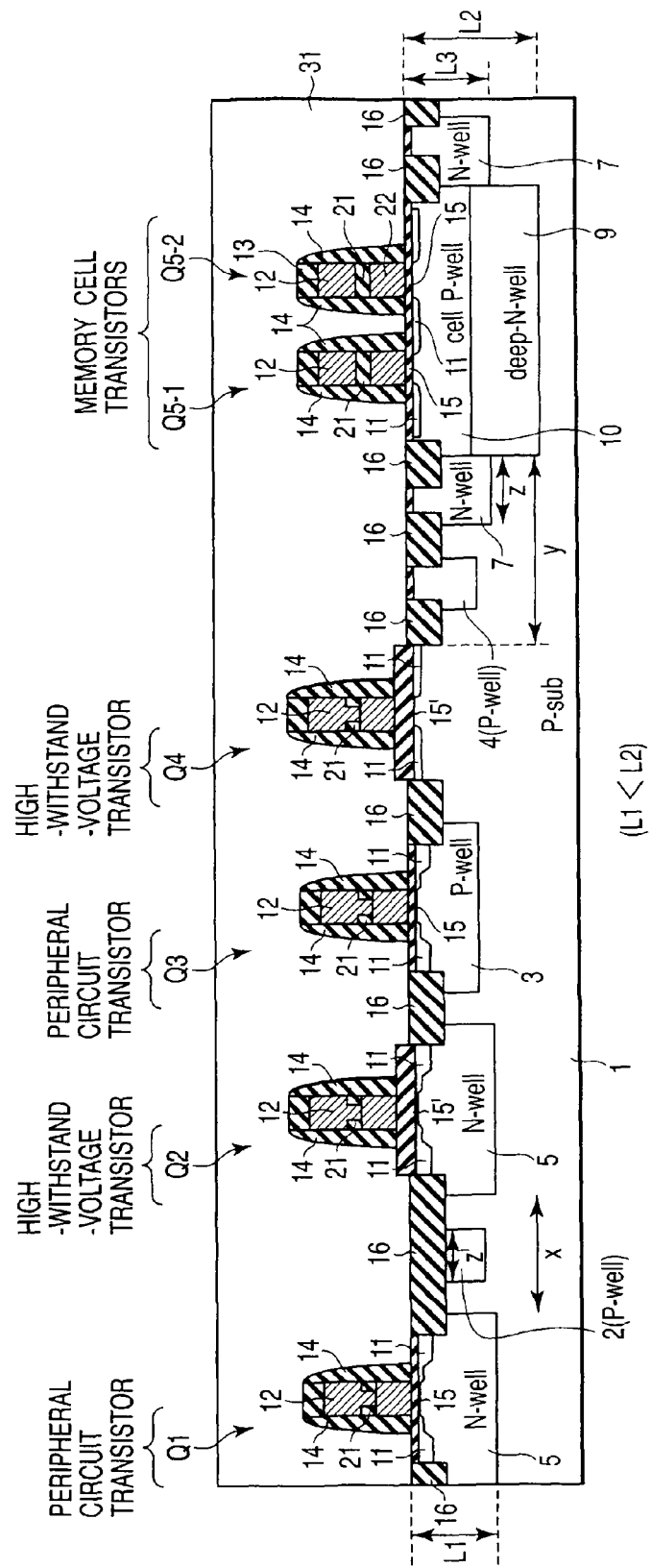
FIG. 10 is a cross-sectional view that shows a nonvolatile semiconductor memory device according to a second embodiment of the present invention.

FIG. 10 is a cross-sectional view that shows an example of the structure of a nonvolatile semiconductor memory device according to a second embodiment of the present invention. In FIG. 10, the parts common to those in FIG. 5 are denoted by like reference numerals, and only different parts are described.

As is shown in FIG. 10, the second embodiment differs from the first embodiment in that the depth L3 of the N-type well (N-well) 7 is shallower than the depth L2 of the N-type well (deep-N-well) 9 and that a region of a change between the depth L3 and depth L2 is present at a boundary region between the lower part of the P-type cell well (cell P-well) 10 and the N-type well 9. In other words, there is a stepped part between the N-type well 7 and N-type well 9. This stepped part is present over the entire region under the N-type well 7. FIG. 11A shows a plan-view pattern of the N-type wells 7 and 9 and P-type cell well 10. FIG. 11B is a cross-sectional view taken along line 11B-11B in FIG. 11A.

As is shown in FIG. 11A and FIG. 11B, the width Dx9 of the N-type well 9 in an X-direction is less than the width Dx7 of the N-type well 7 in the X-direction (Dx9<Dx7). The width Dy9 of the N-type well 9 in a Y-direction that is perpendicular to the X-direction is less than the width Dy7 of the N-type well 7 in the Y-direction (Dy9<Dy7). The N-type well 7 has a ring shape in plan. The entire region in plan of the N-type well 9 is in contact with the entire periphery of the ring-shaped N-type well 7 and is included in the range of the N-type well 7 in plan. Thereby, the stepped part is present in the entire region under the N-type well 7.

In the nonvolatile semiconductor memory device according to the second embodiment, too, the depth L1 of the N-type well 5 is less than the depth L2 of the N-type well 9. Therefore, the same advantageous effect as in the first embodiment can be obtained.

Further, in the nonvolatile semiconductor memory device according to the second embodiment, the depth L3 of the N-type well 7 is less than the depth L2 of the N-type well 9 and the entire plan-view region of the N-type well 9 is included within the plan-view region of the N-type well 7. By virtue of this structure, the following additional advantage can be obtained, compared to the first embodiment.

As is shown in FIG. 5, in the nonvolatile semiconductor memory device according to the first embodiment, the width of the N-type well 9 is almost equal to the width of the outer periphery of the N-type well 7. Consequently, if misalignment of the mask occurs in the photolithography step, for example, in the fabrication step of FIG. 7, the N-type well 9 projects out of the N-type well 7. If the N-type well 9 projects, it is likely that the distance y between the N-type diffusion layer 11 of the high-withstand-voltage transistor Q4 and the N-type well 9 may decrease. It is thus necessary to preset the distance y, taking the alignment margin of the mask into account.

A voltage of 15V or more, relative to the substrate 1, is applied to the N-type diffusion layer 11 of the high-withstand-voltage transistor Q4. If the N-type diffusion layer 11 is located close to the N-type well 9, a punch-through current may flow between the N-type diffusion layer 11 and N-type well 9, or latch-up occurs. To prevent this, the distance y between the N-type diffusion layer 11 of transistor Q4 and N-type well 9 has to be set at, e.g. 0.8 μm or more.

As regards this point, in the nonvolatile semiconductor memory device according to the second embodiment, the entire plan-view region of the N-type well 9 is included within the range of the N-type well 7 in plan view. Thus, there is no need to set the distance y by taking the alignment margin of the mask into account. Therefore, the distance y can be decreased, and this is advantageous for microfabridcation. Typically, in the second embodiment, compared to the first embodiment, the distance y can be reduced by about 0.1 μm without degradation in withstand voltage.

Moreover, since the depth L3 of the N-type well 7 is less than the depth L2 of the N-type well 9, the distance y between the side surface of the N-type well 9 and the N-type diffusion layer 11 of the high-withstand-voltage transistor Q4 is automatically increased. By virtue of the increase in distance y, it becomes possible to suppress, more effectively than in the first embodiment, the flow of punch-through current between the N-type diffusion layer 11 and the N-type well 9 and the occurrence of latch-up. This is advantageous in enhancing the reliability of the nonvolatile semiconductor memory device.

Besides, the side surface of the N-type well 9 is located at a deep part of the P-type substrate 1, for instance, at a position of about 2 μm, whereas the N-type diffusion layer 11 of the high-withstand-voltage transistor Q4 is located at a shallow part of the P-type substrate 1. In addition, the side surface of the N-type well 9 is located more on the P-type cell well 10 side than the side surface of the N-type well 7. Thus, the distance y between the N-type diffusion layer 11 and the side surface of the N-type well 9 can be decreased while the punch-through current and latch-up are suppressed. This is also advantageous for microfabrication. Punch-through and latch-up between the N-type well 7 and N-type diffusion layer 11 can be prevented by the P-type well 4.

Next, an example of a method of manufacturing the nonvolatile semiconductor memory device according to the second embodiment is described.

Figure 12:
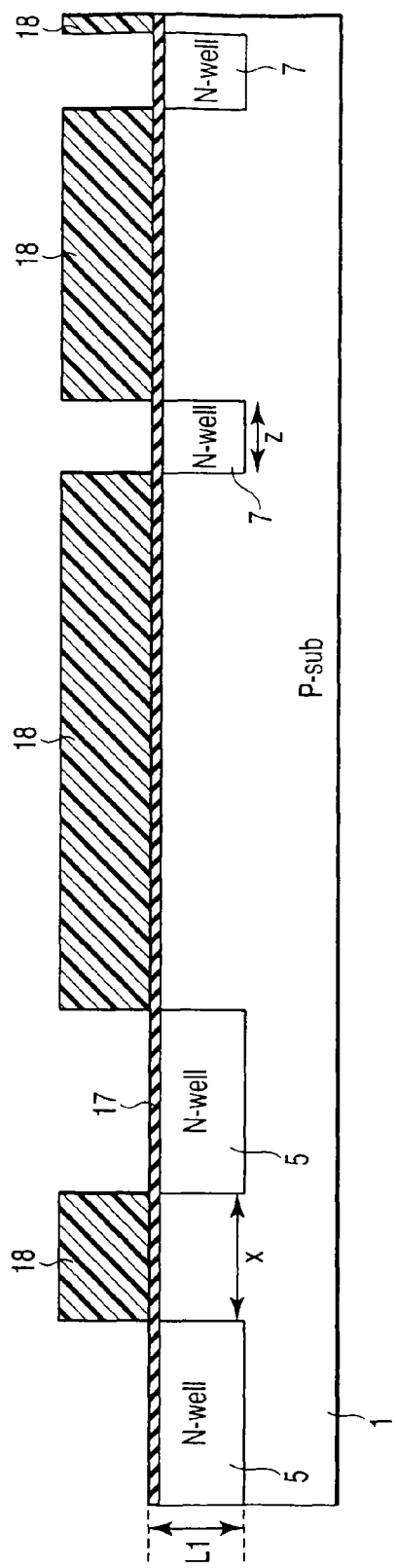
FIG. 12 is a cross-sectional view that illustrates a fabrication step of the nonvolatile semiconductor memory device according to the second embodiment of the invention.
Figure 13:
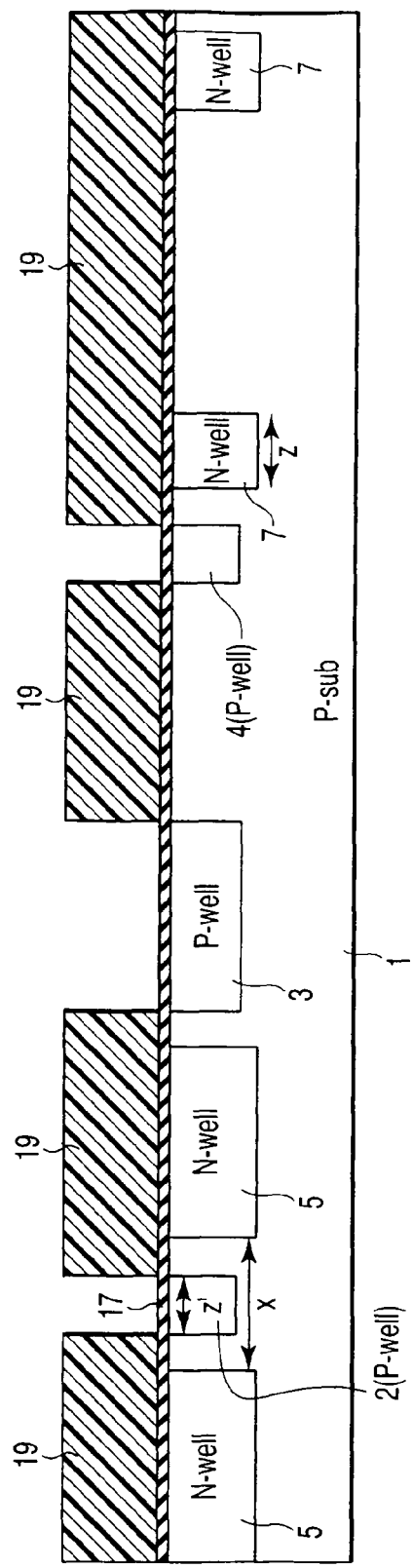
FIG. 13 is a cross-sectional view that illustrates a fabrication step of the nonvolatile semiconductor memory device according to the second embodiment of the invention.
Figure 14:
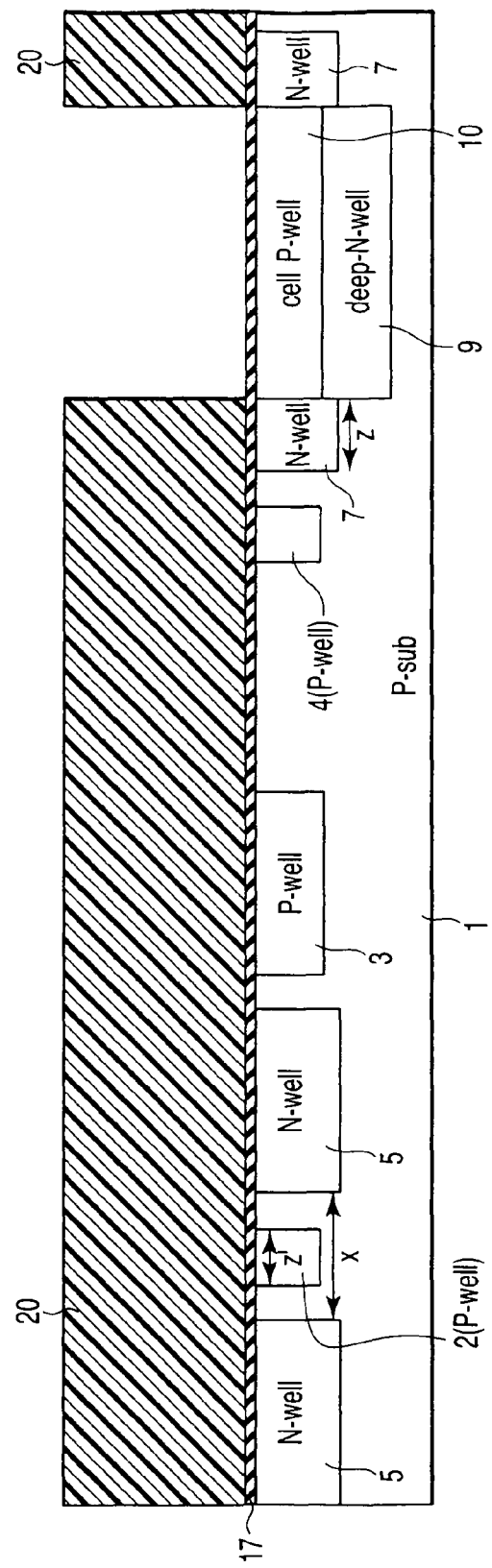
FIG. 14 is a cross-sectional view that illustrates a fabrication step of the nonvolatile semiconductor memory device according to the second embodiment of the invention.

FIG. 12 to FIG. 14 are cross-sectional views illustrating the example of the method of manufacturing the nonvolatile semiconductor memory device according to the second embodiment of the invention.

To start with, as shown in FIG. 12, like the first embodiment, an insulation film (e.g. sacrificial oxide film) 17 is formed on a substrate 1. A photoresist is coated on the insulation film 17, and a photoresist film 18 is formed. The thickness of the photoresist film 18 is, for instance, not greater than 1.6 μm and not less than 0.6 μm. Subsequently, the photoresist film 18 is exposed/developed, and openings corresponding to a formation pattern of N-type wells 5, 7 are formed in the photoresist film 18. Using the photoresist film 18 as a mask, impurities, such as phosphorus or arsenic, for forming the N-type wells 5, 7 are ion-implanted in the substrate 1. In the fabrication step illustrated in FIG. 12, the impurities for forming the N-type wells 5, 7 are implanted to a depth corresponding to about 1.2 to 2 times the depth of the P-type cell well 10 that is to be formed later. Thus, the N-type well 7 is formed shallower than the N-type well 9 that is to be formed later, and is formed so as to come in contact with the N-type well 9. Since it is not necessary to form the N-type well 5 with a large depth, the thickness of the photoresist 18 may be thin. Therefore, like the fabrication step of the first embodiment that is illustrated in FIG. 7, removal of the photoresist film 18 is easier, the process time can be reduced, and the cost of material can be reduced. Of course, an ion implantation step for forming a deep N-type well with a thickness of 1 μm or more can be omitted. The problem that the width of the well tends to increase due to fall-down of the photoresist or resolution can be improved.

Next, as shown in FIG. 13, the photoresist film 18 is removed, and a photoresist is coated once again on the insulation film 17, and a photoresist film 19 is formed. The thickness of the photoresist film 19 is, for instance, not greater than 1.6 μm and not less than 0.6 μm. The photoresist film 19 is exposed/developed, and openings corresponding to a formation pattern of P-type wells 2, 3, 4 are formed in the photoresist film 19. Using the photoresist film 19 as a mask, impurities, such as boron or indium, for forming the P-type wells 2, 3, 4, are ion-implanted in the substrate 1. Like the N-type well 5, for example, the P-type wells 2, 3 and 4 do not need to be formed with a large depth. The thickness of the photoresist film 19 may be less than, i.e. 1.8 μm, if implanted impurities do not penetrate the photoresist film 19. For example, the thickness of the photoresist film 19 can be set at 1.6 μm or less. It is thus possible to obtain narrow P-type wells 2, 3 and 4, like the N-type well 5.

Thereafter, as shown in FIG. 14, the photoresist film 19 is removed, and a photoresist is coated once again on the insulation film 17, and a photoresist film 20 is formed. The thickness of the photoresist film 20 is, for instance, between 1.8 μm and 4 μm. The photoresist film 20 is exposed/developed, and an opening corresponding to a formation pattern of a P-type well 10 is formed in the photoresist film 20. Using the photoresist film 20 as a mask, impurities, such as phosphorus or arsenic, for forming the N-type well (deep-N-well) 9, are ion-implanted in the substrate 1, making use of the opening corresponding to the formation pattern of the P-type well 10. Additionally, using the photoresist film 20 as a mask, impurities, such as boron or indium, for forming the P-type well 10, are ion-implanted in the substrate 1. The N-type well 9 is connected to the N-type well 7 and is formed deeper than the N-type well 7. The P-type cell well 10 is surrounded by the N-type wells 7, 9 and is electrically isolated from the P-type substrate 1.

Subsequently, as shown in FIG. 10, transistors Q1 to Q4 and memory cell transistors Q5-1 and Q5-2 are formed on the substrate 1, P-type well 3, N-type wells 5 and P-type cell well 10. The nonvolatile semiconductor memory device according to the second embodiment of the invention is thus completed.

According to the above-described example of the manufacturing method, the N-type well 9 is formed by a fabrication step that is independent from the fabrication steps of the N-type wells 5, 7. In addition, the N-type well 9 is formed making use of the photoresist film that is used for the formation of the P-type cell well 10. Furthermore, the N-type well 9 is formed such that the upper part thereof is put in contact with the shallowly formed N-type well 7 and the N-type well 9 becomes deeper than the N-type well 7. Hence, like the first embodiment, there is no need to form deep N-type wells 5 for the transistors Q1 and Q2, and it becomes possible to reduce the width of each N-well 5.

Besides, according to the above-described example of the manufacturing method, the N-type well 9 is formed making use of the photoresist film that is used for the formation of the P-type cell well 10. Therefore, compared to the manufacturing method described in connection with the first embodiment, the photolithography step can be omitted.

The present invention is not limited to the first and second embodiments. The methods of forming the device isolation regions and insulation films are not limited to those in which silicon is made into silicon oxide or silicon nitride films. For example, it is possible to adopt a method in which oxygen ions are implanted in deposited silicon, or a method in which deposited silicon is oxidized. The charge accumulation layer may be formed of $TiO_2$, $Al_2O_3$, tantalum oxide, strontium titanate, barium titanate, zirconium-lead titanate, or a stacked film thereof.

The P-type Si substrate is used as the semiconductor substrate. Alternatively, other single-crystal semiconductor substrates containing SiGe mix crystal, SiGeC mix crystal, etc. may be used. The gate electrode may be formed of SiGe mix crystal, SiGeC mix crystal, a silicide or a polycide of TiSi, NiSi, CoSi, TaSi, WSi or MoSi, or a metal such as Ti, Al, Cu, TiN or W. The gate electrode may be formed of a polycrystalline layer or a stacked layer of these materials. Furthermore, the gate electrode may be formed of amorphous Si, amorphous SiGe or amorphous SiGeC, or a stacked layer of these materials. The charge accumulation layer may be formed in a dot shape. In the embodiments, both the memory cell and select transistor are of the N-channel type, but these may be of the P-channel type. In the embodiments, the floating-gate NAND memory cell is exemplified as the memory cell. Alternatively, a NOR-type memory cell, an AND-type memory cell or an imaginary-ground-type memory cell may be used, if the memory cell is of the type wherein data erasure is effected by applying a positive voltage to the well. Needless to say, it is possible to use a MONOS (metal-oxide-nitride-oxide-silicon) type memory cell in which charge is accumulated in an insulation film in place of a floating gate electrode.

Each of the transistors Q1 to Q5 is shown by the cross-sectional structure in the drawings. However, needless to say, all transistors are not necessarily formed at positions in the same cross section, and may be formed on the associated wells.

In the above-described embodiments, the nonvolatile semiconductor memory device of the present invention is described on the basis of the examples in which the invention is applied to the semiconductor memories. The invention is also applicable to a nonvolatile semiconductor memory device incorporating the above-described semiconductor memory, such as a processor, a system LSI, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor memory device comprising:
   forming a first well of a second conductivity type on a semiconductor substrate of a first conductivity type;
   forming a second well of the second conductivity type and a third well of the second conductivity type simultaneously, the second well being formed to reach a top of the first well, and depth from a top surface of the semiconductor substrate to a bottom face of the second well being shallower than a depth from the top surface of the semiconductor substrate to a bottom surface of the first well, and depth from a top surface of the semiconductor substrate to a bottom face of the third well being shallower than a depth from the top surface of the semiconductor substrate to the bottom surface of the first well;
   forming a fourth well of the first conductivity type, the fourth well being surrounded by the first well and the second well; and
   forming first transistors on the fourth well and a second transistor on the third well.

2. The method of claim 1, wherein the second well and the third well have bottom surfaces that are flush with each other are ion-implanted under same conditions.

3. The method of claim 1, further comprising:
   forming a fifth well simultaneously with forming the second well and the third well; and
   forming a third transistor on the fifth well and gate insulation films of the second and third transistors, the third transistor having a thickness that is greater than a thickness of a gate insulation film of the first transistor.

4. The method of claim 1, wherein a potential difference of 15V or more, relative to a potential of the semiconductor substrate, is applied to the third well.

5. The method of claim 1, wherein the first transistors are memory cell transistors, and the first transistor includes a memory cell configured to execute batch-erasure of data.

6. The method of claim 3, further comprising:
   forming a high concentration region of the first conductivity type between the third well and the fifth well and apart from the third well and the fifth well; and forming a trench device isolation region in the semiconductor substrate, the trench device isolation region being interposed between the fifth well and the third well;

wherein the high concentration region has a high impurity concentration in a central part thereof between the third well and the fifth well.

7. The method of claim 1, wherein the third well directly contacts the semiconductor substrate.

8. The method of claim 1, wherein the second well is in contact with the first well to form a stepped contact part; and a boundary between a bottom surface of the third well and the semiconductor substrate is closer to a first surface of the semiconductor substrate than a boundary between the bottom surface of the first well and the semiconductor substrate.

9. The method of claim 6, wherein the high concentration region is ion-implanted under a condition that a bottom surface of the high concentration region is more shallow than a bottom surface of the third well.

10. The method of claim 9, wherein the third well is formed to directly contact the semiconductor substrate.

11. The method of claim 1, wherein the second well and the third well are formed by a mask whose thickness is thinner than that of the first well.

* * * * *